(12) United States Patent
Huber Lindenberger et al.

(10) Patent No.: US 11,162,817 B2
(45) Date of Patent: Nov. 2, 2021

(54) FLUX COUPLING SENSOR AND TARGET

(71) Applicant: MELEXIS TECHNOLOGIES SA, Bevaix (CH)

(72) Inventors: Samuel Huber Lindenberger, Bevaix (CH); Javier Bilbao De Mendizabal, Bevaix (CH); Jan-Willem Burssens, Bevaix (CH); Wolfram Kluge, Bevaix (CH); Jorg Rudiger, Bevaix (CH); Kevin Fahrni, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 16/963,333

(22) PCT Filed: Jan. 22, 2019

(86) PCT No.: PCT/EP2019/051429
§ 371 (c)(1),
(2) Date: Jul. 20, 2020

(87) PCT Pub. No.: WO2019/141858
PCT Pub. Date: Jul. 25, 2019

(65) Prior Publication Data
US 2020/0348151 A1    Nov. 5, 2020

(30) Foreign Application Priority Data

Jan. 22, 2018   (EP) .................................... 18152820

(51) Int. Cl.
*G01D 5/22*   (2006.01)
*G01R 33/00*   (2006.01)

(52) U.S. Cl.
CPC ....... *G01D 5/2225* (2013.01); *G01R 33/0029* (2013.01)

(58) Field of Classification Search
CPC . G01D 5/2225; G01D 5/2053; G01R 33/0029
(Continued)

(56) References Cited

U.S. PATENT DOCUMENTS

| 6,166,535 A | 12/2000 | Irle et al. |
| 10,371,498 B2* | 8/2019 | Moser .................... G01B 7/003 |

(Continued)

FOREIGN PATENT DOCUMENTS

| DE | 202008013715 U1 | 1/2009 |
| EP | 0901002 B1 | 1/2002 |

OTHER PUBLICATIONS

International Search Report and Written Opinion from PCT Application No. PCT/EP2019/051429, dated Apr. 1, 2019.
(Continued)

*Primary Examiner* — Christopher E Mahoney
(74) *Attorney, Agent, or Firm* — Workman Nydegger

(57) ABSTRACT

An apparatus is arranged for sensing a position of a target, in particular for offset invariant sensing of the position of the target is described, as well as the respective target and the method. The apparatus comprises at least two sensor elements. At least one sensor element of the at least two sensor elements generates a magnetic field. At least one other sensor element of the at least two sensor elements receives the magnetic field and outputs at least one signal associated with the received magnetic field. The target affects a coupling of a magnetic flux of the magnetic field between the at least one sensor element generating the magnetic field and the at least one other sensor element receiving the magnetic field and wherein the target is non-rotational invariant.

13 Claims, 7 Drawing Sheets

(58) Field of Classification Search
USPC .................................... 324/207.13, 207.15
See application file for complete search history.

(56) References Cited

U.S. PATENT DOCUMENTS

| | | |
|---|---|---|
| 2001/0005133 A1 | 6/2001 | Madni et al. |
| 2003/0151402 A1 | 8/2003 | Kindler |
| 2011/0181302 A1 | 7/2011 | Shao et al. |
| 2015/0323348 A1 | 11/2015 | Liu et al. |
| 2019/0226877 A1* | 7/2019 | Kluge ............... G01B 7/31 |
| 2020/0355564 A1* | 11/2020 | Venzal ............. G01L 3/108 |
| 2021/0048316 A1* | 2/2021 | Kluge ............. G01D 5/2053 |

OTHER PUBLICATIONS

Extended Search Report from corresponding EP Application No. 18152820.9, dated Apr. 25, 2018.

* cited by examiner

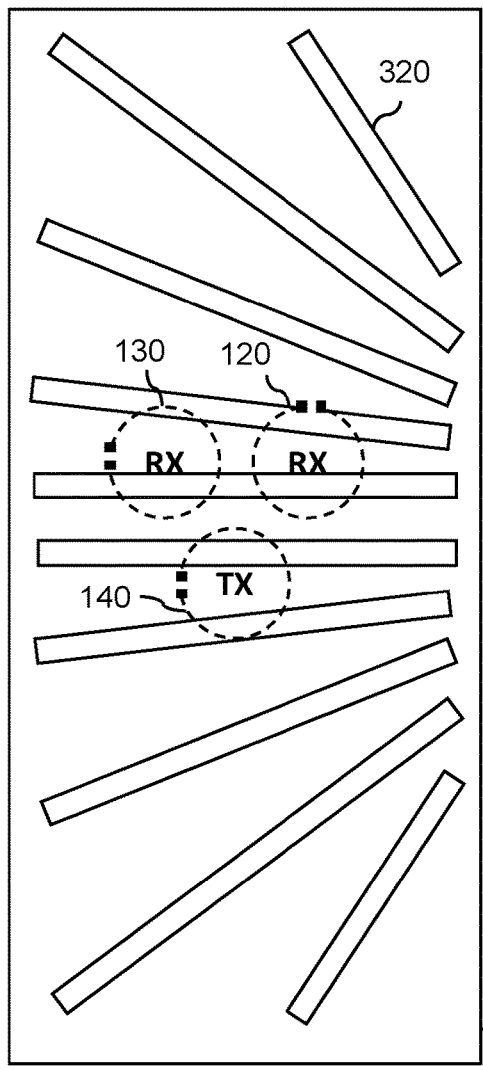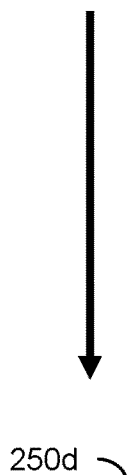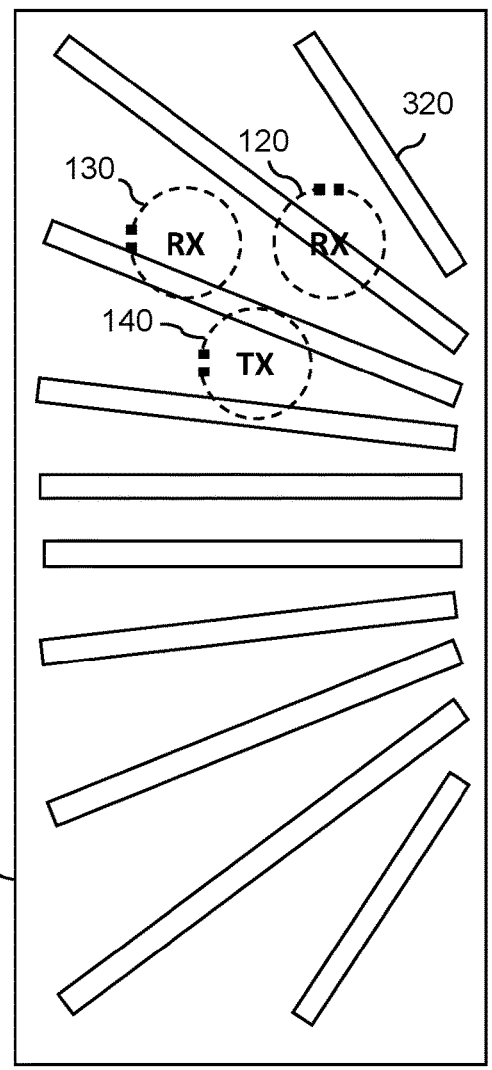
Fig. 5a	Fig. 5b

FLUX COUPLING SENSOR AND TARGET

TECHNICAL FIELD

The current application concerns an apparatus and a method for sensing a position of a target, in particular for offset invariant sensing of the position of the target, by ease of magnetic flux coupling. Also, a target configured to be used with said type of apparatus is described.

BACKGROUND

Apparatuses for measuring a magnetic field property of a magnetic field are often referred to as magnetic field sensors or magnetic sensors. These kinds of sensors have a broad field of use. Often, these kinds of sensors are used in combination with magnetized objects or objects which influence a magnetic field in one way or another. Thereby, the magnetic sensors measure at least one property of the magnetic field either emanated by the object, i.e. originating from the object itself, or influenced by the object. Based on the measured at least one magnetic field property the position of the object is determined, thereby more than one measured at least one magnetic field property may be combined or processed to determine the position of the object. Therefore, these sensors are also often called position sensors. The most common position sensors are thereby linear and angular position sensors. A linear position sensor determines the position of the object on a linear path relative to the sensor, whereas an angular sensor determines the angular orientation of such an object in the vicinity of the sensor. Furthermore, the sensors are also capable of determine a change in the position of the object, for example a motion of the object on a linear path or its rotation.

The position sensors can either perform direct or indirect measurements of the at least one property of the encountered magnetic field to determine the linear and/or angular position of the object. The measured property of the magnetic field allows to quantify the magnetic field, for example in terms of the magnetic field strength, its direction or the magnetic flux etc. and as such allows a determination of the position of the object, which either emanates the magnetic field or affects the magnetic field. For a direct measurement, for example, the magnetic field strength of the magnetic field encountered can be measured, whereas for an indirect measurement the magnetic flux can be measured by measuring a quantifiable property induced by the magnetic flux, for example an induced current or voltage.

Position sensors using direct measurements often times employ Hall elements, in order to measure the magnetic field strength of the encountered magnetic field and then determine the angular and/or linear position of the object based on the measured magnetic field strength.

Position sensors using indirect measurements often times employ inductive sensor elements, for example coils, in order to measure a property induced by the encountered magnetic field and then determine based on the measured induced property the angular and/or linear position of the object, which in this context is also often referred to as target. These magnetic sensors are also often called inductive magnetic sensors, as for example described in US 2015/0323348 A1 and EP 0 901 002 B1. Thereby, the magnetic field which induces the measured property can either originate from the target, for example by eddy currents induced in the target itself, or can originate from a coil generating a magnetic field, which then couples via the target to at least one receiving coil.

Inductive magnetic sensors are not affected by static disturbing magnetic fields (static stray fields) from surrounding components, devices, apparatuses, or the environment in general. Nevertheless, these inductive magnetic sensors are still sensitive to alternating disturbing magnetic fields (alternating stray fields).

Furthermore, since the inductive magnetic sensors must be capable of being integrated in a small packaging, only a limited area can be used for the sensor elements generating the magnetic field and respectively receiving the magnetic field. While the size of the sensor elements shrink, the tolerances of the target position remain unchanged, i.e. their acceptable displacements relative to the sensor remain unchanged. This means the targets can still have a substantial offset as compared to the size of the area used for the sensor elements. Offset in this context refers to any displacement of the target in relation to the inductive magnetic sensors, which leads to a wrong determination of the position of the target. Thereby, a displacement can refer either to a lateral offset of the target and the inductive magnetic sensor, or to an angular offset of the target and the inductive magnetic sensor. In the known inductive magnetic sensors, for example, the target and the sensor elements must be aligned either to a rotational axis or to a linear path, at least to a certain degree, in order to allow the position to be determined correctly. Offset from the rotational axis or the linear path leads to incorrect position determinations. As such, it can be said that known inductive magnetic sensors are not offset invariant. Hence, they are not robust to target offsets, since even a small offset of the target from the expected rotational axis or the expected linear path lead to wrong magnetic field measurements and in turn to wrong position determinations. This means, if the target's axis of rotation or path of movement is offset either due to mechanical tolerances or mechanical wear, the target position cannot be determined accurately, i.e. the determined position of the target deviates from the real position of the target. These target offsets require as such complex correction algorithms or correcting means, if such corrections are even possible. In any case, such corrections are limited to target offsets, which are small with respect to the dimensions of the sensor.

Hence, one of the objects of the current application is to overcome the disadvantages of the known prior art and to provide an improved position sensor that reduces the influences of alternating magnetic stray fields and that is invariant to target offsets. The offset invariant position determination becomes in particular important when the overall size of the sensor becomes smaller and therefore the offsets may be in the order of magnitude of the size of the sensor, respectively its sensor elements, because then offset corrections are nearly impossible. Thereby, the improved position sensor shall also reduce common mode signal, i.e. enhance the useable signal, and reduce the need for highly rotational invariant targets.

SUMMARY

This object is solved by the apparatus and method according to the independent claims of the current application.

An apparatus according to the invention may also be referred to as a sensor, a position sensor, a magnetic sensor, a magnetic position sensor, an inductive sensor, or an inductive position sensor.

The sensor according to the invention is for sensing a position of a target relative to the sensor. This position determination is based on measuring of at least one magnetic field property of a magnetic field affected by the target, wherein this affected magnetic field is emanated by the sensor. The sensor and the target may thereby be configured to allow an offset invariant measurement of the effect which the target has got on the magnetic field, such that the position of the target can be accurately determined even when the target experiences offsets. Thereby, the target may have a shape or form, which affects the magnetic field in one preferred direction, which is substantially the same for the entire target, and the shape or form may be non-rotational invariant. Hence, if the magnetic field emanated from the sensor is known, for example being symmetrically, and the target's shape or form has a predefined direction in which it affects this know magnetic field, the position of the target can be determined based on a measurement of a magnetic field property of the affected magnetic field, which in turn gives an indication of the effect the target's shape or form has got on the emanated magnetic field. The effect the target's shape or form has got on the emanated magnetic field is thereby also substantially unitary over the area of the target which faces the sensor. The target may be larger than the area used for the sensor elements generating and measuring the magnetic field affected by the target. The magnetic field emanated from the sensor may therefore only impinge on a fraction of the area of the target. Since the effect the target's shape or form has got on the emanated magnetic field is substantially unitary over the area of the target, an offset of the position determination is offset invariant. The position determination may thereby be an angular position and/or a linear position determination. The target may be a moveable object, which rotates or moves in a plane, wherein this plane is spatially separated from a plane defined by one or more elements of the sensor which either emanate the magnetic field or measure a magnetic field property of the affected magnetic field. The target may move relatively to the sensor, whereby the sensor may have a fixed position. It is however also possible that the target may have a fixed position and the sensor moves relatively to the target. It is also possible that both, the sensor as well as the target move relatively to one another. Thereby, the sensor and/or the target may be mounted to/on moveable parts, for example, moveable parts of a vehicle.

In order to achieve the aforementioned offset invariant position determination, the sensor according to the invention comprises at least two sensor elements, which form elements of the sensor. It shall be understood by a person skilled in the art that even so only two sensor elements are named here, any number of sensor elements equal or greater than two may be implemented. The sensor elements may be magnetic sensor elements like magneto resistive elements or Hall elements, or inductive elements. An inductive element may, for example, be a coil, a wire, a wire in the shape of a coil, a wire in the shape of a spiral, or a wire in the shape of a helix, a loop, a multi turn loop, a solenoid, an inductor, or an array.

At least one of the at least two sensor elements of the sensor according to the invention is configured to generate a magnetic field. It can also be said that the respective at least one sensor element emanates the magnetic field. This at least one sensor element may therefore also be referred to as a generating sensor element or a transmitting sensor element. The emanated magnetic field is thereby a vector field, denoted B, which may comprise the three components $B_x$, $B_y$, and $B_z$ in a three-dimensional Cartesian coordinate system. However, a person skilled in the art will recognize that also other components may be possible, which are only dependent on the definition of the used coordinate system. The at least one transmitting sensor element may generate the magnetic field as a response to an electric current, which may be applied to the transmitting sensor element. The electric current causes a movement of electromagnetic charges. As known in the art, a movement of electromagnetic charges generates a magnetic field. The generated magnetic field may have a known form, for example, the generated magnetic field may be a symmetric magnetic field.

Further, at least one other of the at least two sensor elements is configured to receive a magnetic field, respectively measure a property of a magnetic field which it encounters. The at least one sensor element, which receives the magnetic field may also be referred to as receiving sensor element. Thereby, the magnetic field received by the receiving sensor element is the one emanated from the at least one transmitting sensor element, but affected by a target moving in the vicinity of the sensor. It can also be said that the magnetic field lines, which are emanated from the at least one transmitting sensor element, couple via the target to the at least one receiving sensor element. Hence, it can also be said that the magnetic flux emanated by the at least one transmitting sensor element is coupled to the at least one receiving sensor element via the target. Thereby, the magnetic flux is a measurement of the total magnetic field which passes through a given surface. Hence, the magnetic flux is related to the number of magnetic field lines of the magnetic field, which pass through the given surface, i.e. the density of the magnetic field lines. The magnetic flux coupling causes the at least one receiving sensor element to output a current or a voltage, wherein the magnitude of the outputted current or voltage is dependent upon the encountered magnetic flux. It can also be said that the output signal is associated with the received magnetic field. For example, if the receiving sensor element is a Hall element, then a Hall voltage is generated. If the receiving sensor element is an inductive element, for example a coil, then a current is generated. The induced current may however also be associated with an inductive voltage. Thereby, the encountered currents or voltages give a direct indication of how the target has affected the magnetic field emanated from the at least one transmitting sensor element. For example, the encountered currents or voltages give an indication how the emanated magnetic field was deformed, i.e. how the course of the magnetic field lines of the emanated magnetic field was altered, by the target. In turn, the encountered currents or voltages give an indication how much of the originally emanated magnetic flux is received by the at least one receiving sensor element. Since the currents or voltages are dependent upon the magnetic flux encountered by the at least one receiving sensor element they give an indication of the position of the target. Furthermore, a change in the currents or voltages can be used to determine a change in the position of the target, since when the position of the target changes also the emanated magnetic field is affected differently, which in turn means the magnetic flux encountered by the at least one receiving sensor element changes. The currents or voltages outputted by the at least one receiving sensor element can then either directly be an indication of the position of the target, or can be further combined or processed for the position determination. The position determination may be outputted by the sensor as a signal, wherein this signal may be based at least partially on the measurements of the at least one magnetic field property of the affected magnetic field by the at least one receiving sensor element.

Hence, the coupling between the at least one transmitting sensor element and the at least one receiving sensor element is affected, i.e. influenced, by the target and in particular the shape or form of the target itself. The shape or form of the target may influence the magnetic field lines to align in a preferred direction. Hence, if the target is moved and the at least one other receiving sensor element lies within this preferred direction, the magnetic flux coupling between the at least one transmitting sensor element and the at least one receiving sensor element is the highest. This situation changes again, when the target is moved and as such the emanated magnetic field is again affected differently. Based on the amount of measured property, for example induced voltage or current, at the at least one receiving sensor element, the position of the target can be determined, because the amount of the property measured at the at least one receiving sensor element gives a measure of the magnetic flux coupling. If the property is high, then the magnetic flux coupling is high, which in turn means the preferred direction of the target is aligned with a connecting line of the at least one transmitting sensor element and the at least one receiving sensor element. If the amount of the property is low, then the magnetic flux coupling is low, which in turn means the preferred direction of the target is not aligned with a connecting line of the at least one transmitting sensor element and the at least one receiving sensor element. The magnetic flux coupling can however also be differently exploited with more than two sensor elements. In an example of three sensor elements, one sensor element may be used as a transmitting sensor element and the other two may be used as receiving sensor elements. The magnetic flux coupling between the transmitting sensor element and each of the receiving sensor elements is then dependent on whether the preferred direction of the target lies in a direction of a connecting line, which spatially connects the transmitting sensor element and the respective one of the two receiving sensor elements. For example, if one of the receiving sensor elements, as seen from a location of the transmitting sensor element, lies within the preferred direction of the target, the magnetic flux coupling between the at least one transmitting sensor element and the respective at least one receiving sensor element is the highest, whereas the other one of the at least two receiving elements may not lie within the preferred direction and may encounter a weaker magnetic flux coupling, such that the at least two receiving elements will generate different output signals, for example different voltages or currents. Nevertheless, based on the property measured by the at least one receiving element, the position of the target can be determined. Besides only affecting the emanated magnetic field, by influencing the direction or the orientation of the magnetic field lines, it may also be possible for the target to concentrate the magnetic field lines at a particular region, for example at the location of the at least one receiving sensor element. Further, it may also be possible for the target to push the magnetic field lines aside from a particular region. Thereby, it may be possible to reduce the number or the density of the magnetic field lines in the location of at least one of the receiving sensor elements.

The shape or form of the target affects the coupling of the magnetic flux of the emanated magnetic field in an offset invariant manner. Thereby, offset invariant manner refers to the fact that the target has a shape or form, which affects the magnetic flux coupling between the at least one transmitting sensor element and the at least one receiving sensor element in a way that a target offset has only minimal to no effect on the current or voltage outputted by the at least one receiving element.

This is achieved by ease of a non-rotational invariant shape or form of the target. For example, in angular position sensors the shape or form of the target is non-rotational invariant with respect to a rotation of the target relatively to the at least two sensor elements. In an example of a linear position sensor, the shape or form of the target changes with respect to a direction of an expected linear change of the position of the target relatively to the sensor elements. In any of these cases, non-rotational invariant means that, the shape or form of the target as seen from a location of the sensor, in particular from at least one specific sensor element, may not be the same when the target is rotated about an axis in an arbitrary angle. As such, it can also be said the shape or form of the target is anisotropic. An anisotropic target is characterized in that the shape or form of the target is different if it is viewed from different directions. This means the shape or form of the target affects the course of the magnetic field lines of the emanated magnetic field differently for different positions of the target, such that the current or voltage in the at least one receiving sensor elements is different for different positions of the target and give an indication of the position of the target. Thereby, the shape or form of the target may be constituted by a structure, which defines a preferred direction how the target influences the course of the magnetic field lines of the emanated magnetic field. Hence, the shape or form of the target may cause the magnetic field lines of the emanated magnetic field to align with this preferred direction. This alignment is not changed if the target is offset, because an offset caused for example by a displacement of the target may not change how the shape or form of the target influences the course of the magnetic field lines of the emanated magnetic field. In other words, the target facing the sensor may define a target plane and the shape or form of the target within this target plane may be translational invariant on at least one axis comprised in the target plane. This in turn means that even so the target is offset, the relative magnetic flux coupling between the at least one transmitting sensor element and the at least one receiving sensor element, represented by ratios of signals or differential signals, remains substantially the same, even when the target is offset.

Therefore, the apparatus according to the invention for the first time allows to determine a position of a target with a sensor, wherein the position sensing is invariant with respect to an offset of the target and the respective sensor elements. Thereby, at least two of the at least two receiving sensor elements may pairwise opposing each other and the at least one transmitting sensor element may be spatially distant to the at least two of the at least two receiving sensor elements. It can also be said that at least one point within the spatial extend of one of the two opposing sensor elements opposes a point within the spatial extend of the other of the two opposing sensor elements. Thereby, these points may for example be the centers of the two opposing sensor elements. For example, the points within the spatial extend of the receiving sensor elements may be located on a line, then a point within the spatial extend of the at least one transmitting sensor element may be located with a particular distance to said connecting line. The particular distance of the at least one transmitting sensor element may lead to an arrangement of the at least three sensor elements in a triangular shape, i.e. if the particular distance is greater than zero. However, it is also possible that the particular distance may be zero, such that the transmitting sensor element is also located on the line, which connects the at least two receiving sensor elements. The at least three sensor elements may be spaced apart from one another, or may be adjacent to one another. It is also possible that the at least three sensor elements at least partially overlap each other.

In one preferred embodiment of the invention, the apparatus comprises at least three sensor elements, wherein at least two sensor elements of the at least three sensor elements generate a first and a second magnetic field, and wherein at least one sensor element of the at least three sensor elements receives a superposition of the first and second magnetic field and outputs at least one signal associated with the received superposition of the first and second magnetic field. Thereby, at least two of the at least two transmitting sensor elements may be pairwise opposing each other and the at least one receiving sensor element may be spatially distant to the at least two of the at least two transmitting sensor elements. It can also be said that at least one point within the spatial extend of one of the two opposing sensor elements opposes a point within the spatial extend of the other of the two opposing sensor elements. Thereby, these points may for example be the centers of the two opposing sensor elements. For example, the points within the spatial extend of the transmitting sensor elements may be located on a line, then a point within the spatial extend of the at least one receiving sensor element may be located with a particular distance to said connecting line. The particular distance of the at least one receiving sensor element may lead to an arrangement of the at least three sensor elements in a triangular shape, i.e. if the particular distance is greater than zero. However, it is also possible that the particular distance may be zero, such that the receiving sensor element is also located on the line, which connects the at least two transmitting sensor elements. The at least three sensor elements may be spaced apart from one another, or may be adjacent to one another. It is also possible that the at least three sensor elements at least partially overlap each other.

In one preferred embodiment of the invention, at least one of the at least two sensor elements is arranged within a first plane and a surface of the target facing the at least one of the two sensor elements is located in a second plane, wherein the first and second plane have a particular distance to one another. Thereby, said distance of the second plane relatively to the first plane may be a distance at least partial in the direction of a normal vector of the first plane. Within the first plane also more than one of the at least two sensor elements may be arranged. For example, the at least one receiving sensor element may be arranged in the first plane, whereas the at least one transmitting sensor element may be arranged in a plane also distant from the first plane. This distance may be chosen so that this another plane is closer to the second plane as the first plane or may be further apart from the second plane as the first plane. The first and the second plane may be parallel with respect to each other.

In one preferred embodiment of the invention, at least a portion of the at least two sensor elements is configured to change its operational mode from generating a magnetic field to receiving a magnetic field and vice versa. However, it is clear to a person skilled in the art that the sensor elements may also possess an operational mode in which they are idle, hence neither generating nor receiving the magnetic field. Thereby, at least a portion of the sensor elements may refer to at least one sensor element, or all sensor elements, or an arbitrary number of sensor elements greater than one. In detail, the at least two sensor elements may be configured in a first operational mode such that, at a single point in time, at least one of the at least two sensor elements is generating a magnetic field and that the other sensor element of the at least two sensor elements is receiving the magnetic field generated by the transmitting sensor element. In a second operational mode, at a subsequent point in time, the at least two sensor elements may change their operational modes such that, another one of the at least two sensor elements is generating the magnetic field while the respective other of the at least two sensor elements receives the generated magnetic field. It is clear to a person skilled in the art that the sensor elements, which in a first point in time operate in a first operational mode, do not need to change to the second operational mode in a second point in time. As such, all the sensor elements may have different operational mode cycles, which may be independent from the operational mode cycles of the other sensor elements. Furthermore, it is contemplated that the different sensor elements may change their sensitivity and/or the strength of the magnetic field they produce.

This change of operational mode may follow a particular operating cycle with a particular cycle time. This means the magnetic flux coupling between the at least one transmitting sensor element and the at least one receiving sensor element can not only be measured with one configuration, but actually with several, such that more than one position determination can be performed. For example, if the cycle times are low in comparison to the change of the position of the target, the different measurements taken at subsequent points in time can be used to enhance position determination capabilities. Although the at least two sensor elements may be configured to change their operational modes, it may also be possible that at least one sensor element of the at least two sensor elements keeps its operational mode while the respective other sensor element change their operational modes.

In one preferred embodiment of the invention, the at least one transmitting sensor element is configured to generate an alternating magnetic field. While each magnetic field is characterized by a north pole and a south pole, an alternating magnetic field is characterized by a change in the position of the north pole and the south pole. For example, the north and the south pole may fluctuate such that after a certain time, the north pole becomes the south pole while the south pole becomes the north pole. This fluctuation may be periodic and may be characterized by a periodic duration. This periodic duration may be the cycle time of the alternating magnetic field. Technically, the alternating magnetic field may be caused by driving the at least one transmitting sensor element with an alternating current or voltage. The generated magnetic field may be a symmetric magnetic field. If the magnetic field impinging on the target is produced by several transmitting sensor elements, then these transmitting sensor elements can produce synchronized alternating magnetic fields or non-synchronized alternating magnetic fields. For example, one transmitting sensor element may produce in one time instance, i.e. a fixed point in time with no duration, a magnetic field, which north pole is facing the target, whereas in the same time instance a second transmitting sensor element is producing a magnetic field, which north pole is also facing the target, whereas in a second time instance both transmitting sensor elements produce each a magnetic field which south pole is facing the target. In this respect, it can also be said that the at least two transmitting sensor elements produce synchronized alternating magnetic fields. However, they can also produce both non-synchronized alternating magnetic fields. For example, one transmitting sensor element may produce in one time instance a magnetic field, which north pole is facing the target, whereas in the same time instance a second transmitting sensor element is producing a magnetic field, which south pole is facing the target, and vice versa in a second time instance.

In one preferred embodiment of the invention, the at least one transmitting sensor element is inductively coupled to the at least one receiving sensor element via the target. The target affects the emanated magnetic field, i.e. the target deforms the emanated magnetic field. This deformation is caused by induced eddy currents within the target, wherein these eddy currents are induced by the magnetic field emanated by the at least one transmitting sensor element. It is thereby clear to a person skilled in the art that the magnetic field generated by at least one transmitting sensor element comprises a gradient in the magnetic flux, which causes the eddy currents to flow within the target. If more than one transmitting sensor element is used, the magnetic field is constituted by the superposition of the at least two magnetic fields produced. In order to also in this case encounter a gradient in the magnetic field, either the magnetic fluxes of the generated magnetic fields can be different and/or the direction of the generated magnetic fields can be different. The eddy currents themselves produce a magnetic field, which leads to the deformation of the emanated magnetic field.

In general, it can be said that the magnetic flux of the impinging magnetic field at the target generates eddy currents that will flow along discrete paths defined by structures of the target. Thereby, some of these eddy currents may cancel out each other, whereas others will be strengthened dependent upon the difference in geometry of the structures and/or the difference in magnetic fluxes impinging on the target.

For example, if the target has got structures with the same inductance, the impinging magnetic field needs to exhibit a gradient, in order that the partially and/or purely induced eddy currents are not cancelled out, whereas if the target has got structures with difference in inductance between adjacent structures, the magnetic field does not need to exhibit a magnetic gradient. As such, with the geometry of the structures and therefore the shape or form of the target, it can be accounted for different impinging magnetic field situations.

This can be exploited, for example in order to increase the eddy currents along the preferred direction of the target. Hence, in turn increase the magnetic field produced by the eddy currents and as such increase the effect of the target.

As such, the target's shape or form deforms the emanated magnetic field in a preferred direction by defining conductive paths, along which the eddy currents can flow, which themselves produce a magnetic field, which affects the first magnetic field. The deformed emanated magnetic field is then measured by the at least one receiving sensor element. It can also be said that the effect the target has got on the emanated magnetic field is measured, such that by ease of this measurement the position of the target can be determined. The eddy currents induced within the target and their associated magnetic field are dependent upon the shape or form of the target and how the eddy currents can flow within the target. As such, the deformation of the emanated magnetic field caused by the target is dependent upon its shape or form. The target's shape or form thereby preferably deforms the emanated magnetic field in a preferred direction. Because the target is non-rotational invariant, this preferred direction is only encountered at discrete positions of the target, such that the target's position can be determined based on the measurement of the deformation of the emanated magnetic field. Thereby, the deformed emanated magnetic field causes a current or voltage at the at least two receiving sensor elements. The magnitude of the caused current or voltage caused at the at least one receiving sensor element is dependent upon how the target and as such the preferred direction of the deformation of the emanated magnetic field is orientated relatively to the at least one receiving sensor element, such that the current or voltage values give an indication of the orientation and as such the position of the target.

In one preferred embodiment of the invention, the at least two sensor elements are implemented together with means for driving the at least one transmitting sensor element and/or with means for processing signals that are outputted by the at least one receiving sensor elements The means for driving the at least one transmitting sensor element may be configured to provide the at least one transmitting sensor element with an alternating current. The means for processing signals that are outputted by the at least one receiving sensor element may combine signals, i.e. the current or voltage values, outputted by the at least two receiving sensor elements or by at least one receiving sensor element at different times. The combination may thereby be constituted my forming a difference and/or a sum of the respective signals. Furthermore, also other mathematical combinations may be performed, in order to output at least one signal indicative of the position of the target. For example a ratio may be formed. The means for processing may perform calculation of the respective signals to output directly the position of the target. Furthermore, the means for processing may perform a comparison of the outputted signals of the at least one receiving sensor element and stored values. The stored values thereby may give an indication of values to be expected by the at least one receiving element for particular positions of the target. The stored values may thereby be stored during an initial calibration run or may be modelled results. The sensor may therefore also comprise means for storing. The means for storing may thereby store the values in a lookup table. The respective values may also be referred to as reference values. The means for processing may be a processing unit, an integrated circuit or an evaluation circuit. The means for driving the at least one transmitting sensor element and/or the means for processing and/or the means for storing may be implemented in one die or a molded package for a semiconductor chip.

The above-mentioned object is also solved by a target configured to be used with an apparatus for sensing a position of the target. Thereby, the target is configured to be used with an apparatus for sensing of a position of the target, in particular for offset invariant sensing the position of the target, wherein the apparatus comprises at least two sensor elements, wherein at least one sensor element of the at least two sensor elements generates a magnetic field and wherein at least one other sensor element of the at least two sensor elements receives the magnetic field, wherein the target, for example by ease of its shape or form, is configured to affect a coupling of a magnetic flux of the magnetic field between the at least one transmitting sensor element and the at least one receiving sensor element and wherein the target is non-rotational invariant. It can for example be said that the shape or form of the target is non-rotational invariant.

Magnetic flux coupling between the at least one transmitting sensor element and the at least one receiving sensor element may be affected by ease of the shape or form of the target. As the magnetic field lines from the emanated magnetic field pass through the target, eddy currents in the target are induced, which themselves generate a magnetic field, which affects the magnetic field emanated by the at least one transmitting sensor element. Thereby, the shape or form of the target causes the eddy currents to flow in a preferred direction, such that the target also affects the emanated magnetic field in a preferred direction. Thereby, the target comprises a plurality of closed discrete structures of electrically conductive paths for allowing the eddy currents to flow therein. The orientation of the closed discrete structures may set forth the preferred direction the shape or form of the target affects the emanated magnetic field. Thereby, the operational predefined size of the electrically conductive paths is preferably larger than the at least two receiving sensor elements. It can also be said that the conductive paths providing a modulated conductivity in one direction and an essentially constant conductivity distribution in a second direction. Hence, the impinging magnetic field is attenuated more in the first direction than in the second direction. It can also be said that the shape or form of the target attenuates the emanated magnetic field more in a first direction than in a second direction. Thereby, the first and the second direction are preferably substantially perpendicular to one another. Furthermore, the first and second direction preferably span a plane, which is parallel to a plane in which at least one of the at least two sensor elements of the sensor is arranged. Due to the attenuation, the emanated magnetic field is deformed, wherein this deformation is measured by the at least one receiving sensor element, such that the position of the target can be determined. Since the target deforms the course of the magnetic field lines of the emanated magnetic field, it can also be said that the magnetic flux between the at least one transmitting sensor element and the at least one receiving element is affected by the target. Hence, the magnetic flux coupling between the at least one transmitting sensor element and the at least one receiving sensor element is affected by the target.

Thereby, the shape or form of the target is non-rotational invariant in the sense that a displacement of the target and the sensor elements does not lead to a wrong determination of the position of the target, since such a displacement of the target has no influence on the preferred direction in which the shape or form of the target deforms the emanated magnetic field. If the target is offset, then the relative deformation of the magnetic field lines of the emanated magnetic field experience is still the same as compared to the non-offset position of the target. Non-rotational invariant means that the shape or form of the target as seen from a location of the sensor, in particular from at least one sensor element, is not the same when the target is rotated about an axis in an arbitrary angle. As such, it can also be said the shape or form of the target is anisotropic.

The shape or form of the target can be constituted by a structure, which directs the eddy currents induced in the target to flow in a particular direction, such that the effect the target has got on the emanated magnetic field is also directional, i.e. in one preferred direction. Thereby, the particular pattern may be formed by at least one recess and/or at least one slit in the target. A slit in the target may extend from one side of the target to the opposite side. For example, the slit may be a hole in the target, wherein said hole has a depth of the entire thickness of the target. In other words, a slit may be configured in such a way that it penetrates the whole thickness of the body of the target. Thereby, the slit may have any shape or form that is suitable to direct the flow of the eddy currents within the target, namely around the slit. A recess however, may extend from one side of the target to a point somewhere inside of the body of the target and does not extend to the opposite side of the target, i.e. a recess may be a hole in the target, wherein said hole has a depth smaller than the entire thickness of the target. Also, a recess is used to direct the flow of the eddy currents and as such allows the target to produce a directional magnetic field in order to affect the emanated magnetic field in a preferred direction.

In one preferred embodiment of the invention, the target has a planar shape. Thereby, the surface of the target facing the sensor may span a plane which is substantially parallel to a plane in which at least one of the two sensor elements is arranged.

In one preferred embodiment of the invention, the target is made from a conductive material. The conductive material may be a metal, in particular, a ferromagnetic metal. However, the person skilled in the art will also contemplate that other materials as metal may be used, which possess conductive properties.

The above-mentioned object is also solved by a system for sensing a position of a target, in particular for offset invariant sensing of the position of the target. Thereby, the system comprises at least two sensor elements, which may be referred to as a sensor, and a target, wherein at least one sensor element of the at least two sensor elements generates a magnetic field, wherein at least one other sensor element of the at least two sensor elements receives the magnetic field, wherein the target affects a coupling of a magnetic flux of the magnetic field between the at least one transmitting sensor element and the at least one receiving sensor element and wherein the target is non-rotational invariant.

The above-mentioned object is also solved by a method for sensing a position of a target. Thereby, the method comprises the steps of generating a magnetic field by at least one sensor element of at least two sensor elements, receiving the magnetic field by at least one other sensor element of the at least two sensor elements and the at least one receiving sensor element outputting at least one signal associated with the received magnetic field, wherein the target affects a coupling of a magnetic flux of the magnetic field between the at least one transmitting sensor element and the at least one receiving sensor element and wherein the target is non-rotational invariant. It can also be said that the method comprises the step of affecting the magnetic field generated by the at least one transmitting sensor element, i.e. deforming the emanated magnetic field by the target.

In one preferred embodiment of the invention, the method further comprises calculating the position of the target based on the outputted signal from the at least one receiving sensor element. It is clear to a person skilled in the art that also more than one receiving sensor element can be used and that the calculation in this context can be based on the respective output signals.

In one preferred embodiment of the invention, the method further comprises comparing the outputted signal values to stored values, which are either modelled or taken during a calibration run. The stored values thereby give an indication of the signal values to be expected for a particular position of the target.

BRIEF DESCRIPTION OF THE DRAWINGS

The following description and the annexed drawings set forth in detail certain illustrative aspects of the apparatus, the target, and the method described above. These aspects are indicative, however, of but a few of the various ways in which the principles of various embodiments can be employed and the described embodiments are intended to include all such aspects and their equivalent.

In the drawings, like reference characters generally refer to the same parts throughout the different drawings. The drawings are not necessarily to scale, emphasis instead generally being placed upon illustrating the principles of the invention.

Figure 1:
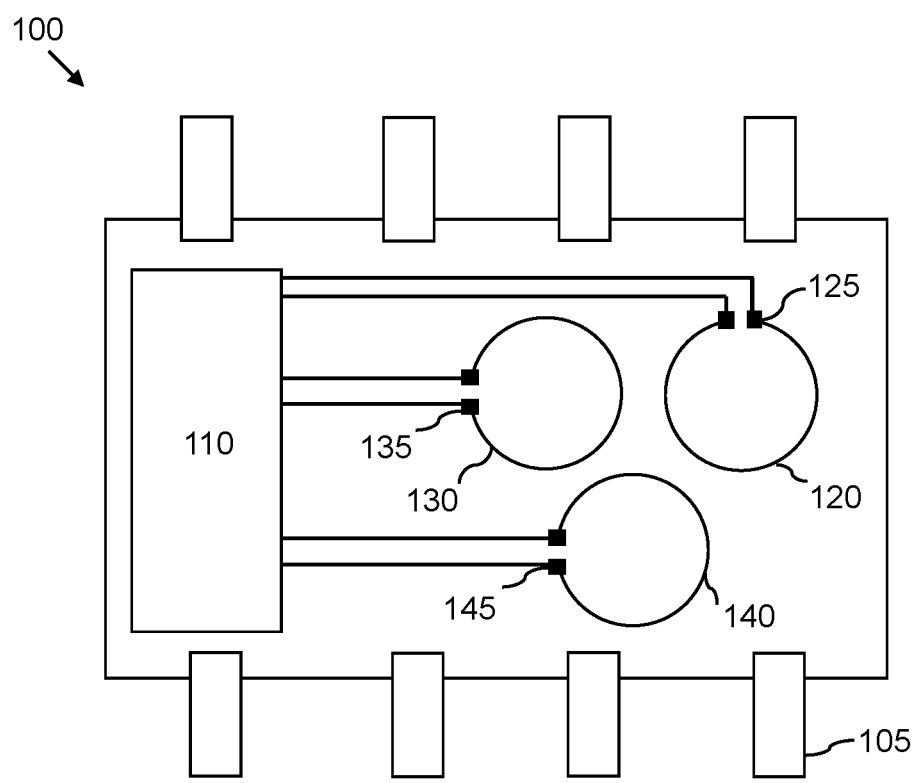
Figures 2A, 2B, 2C:
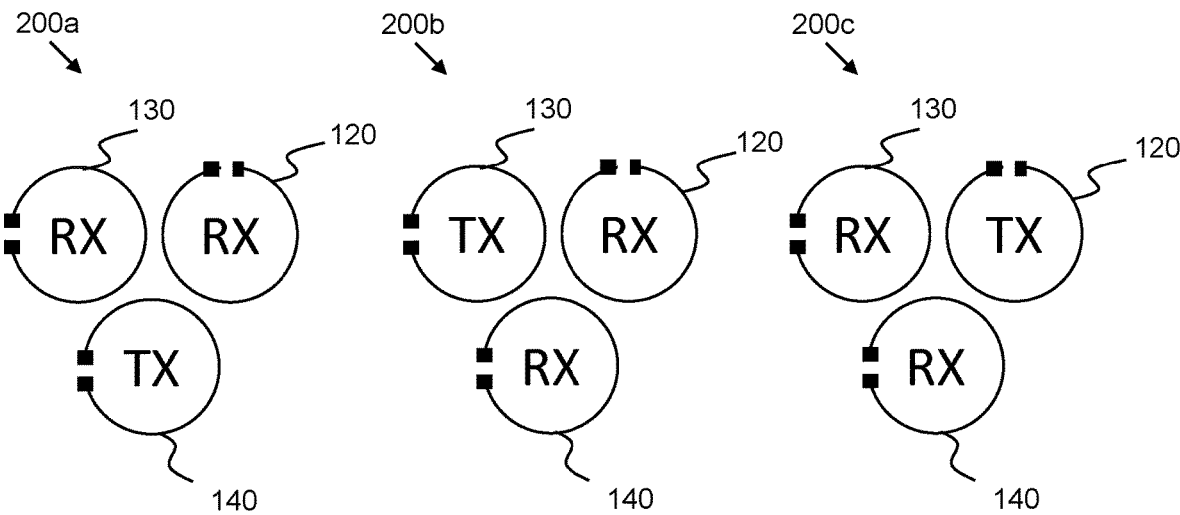
Figure 2D:
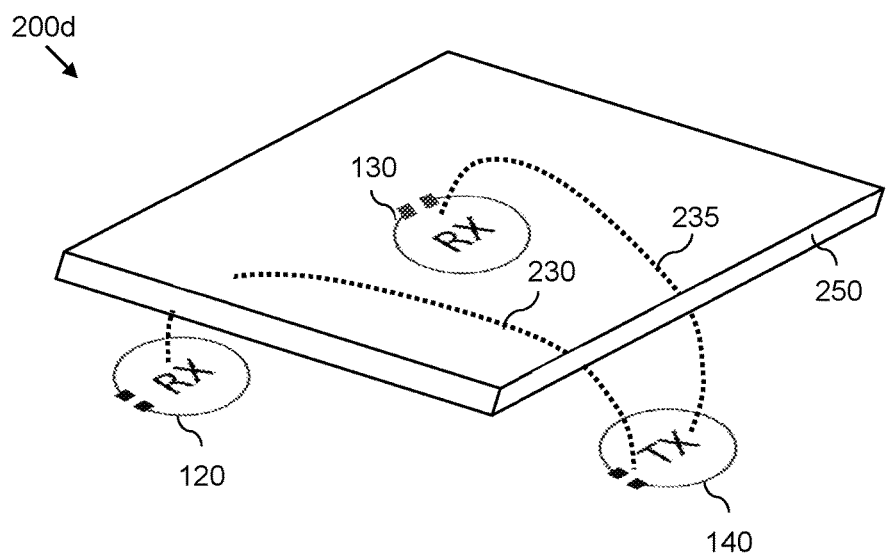
Figure 3A:
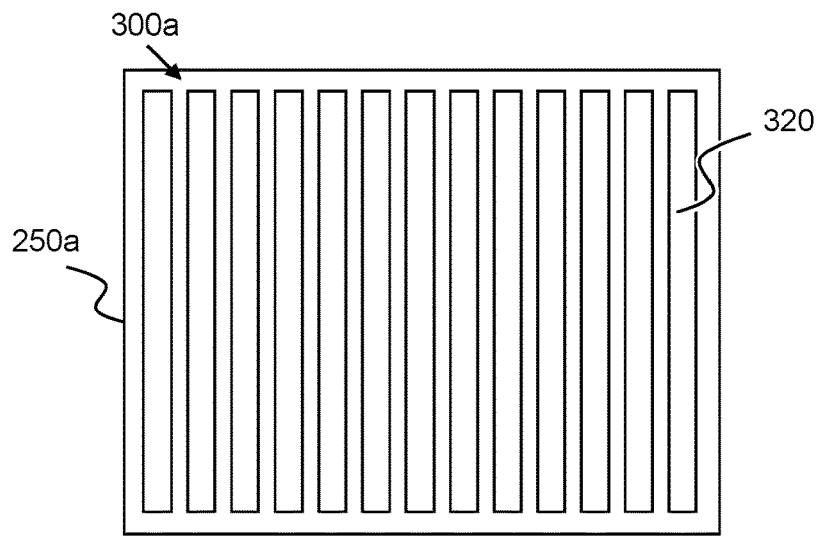
Figure 4A:
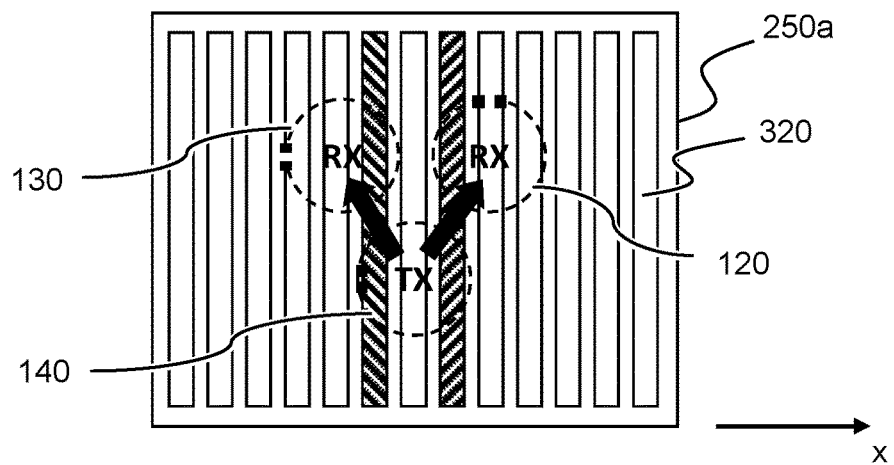
Figure 6:
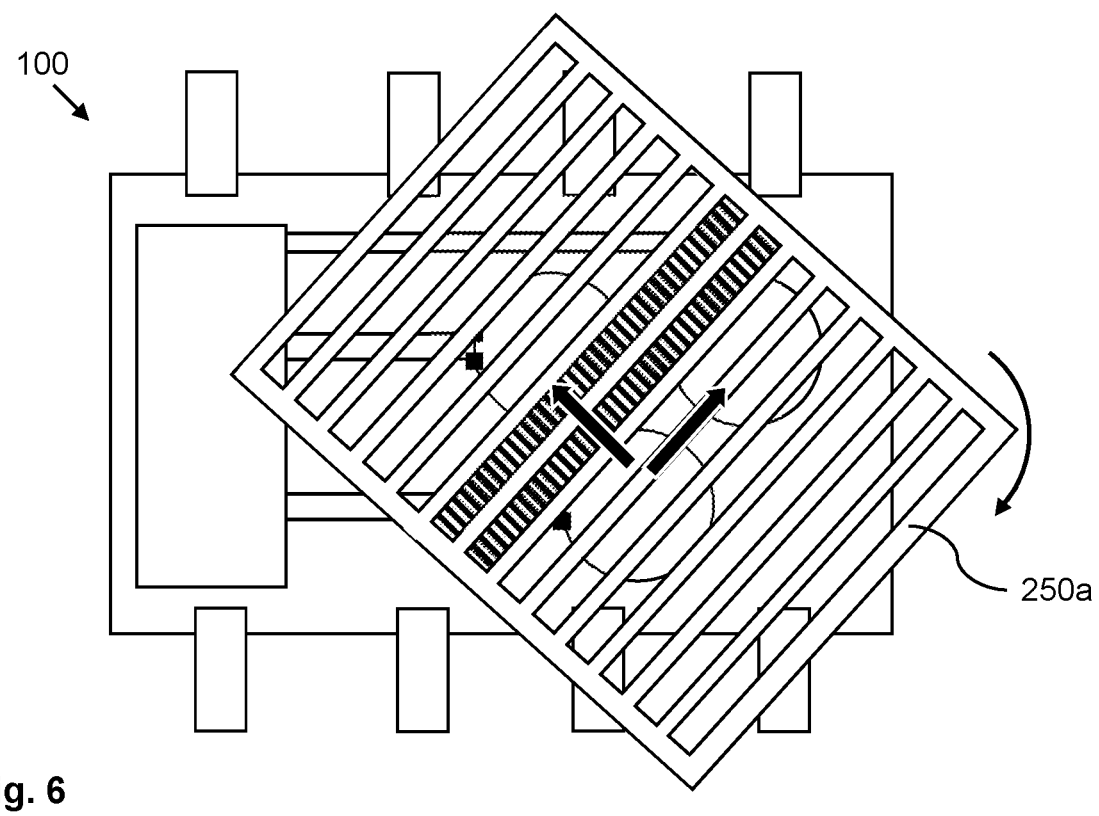
Figure 7:
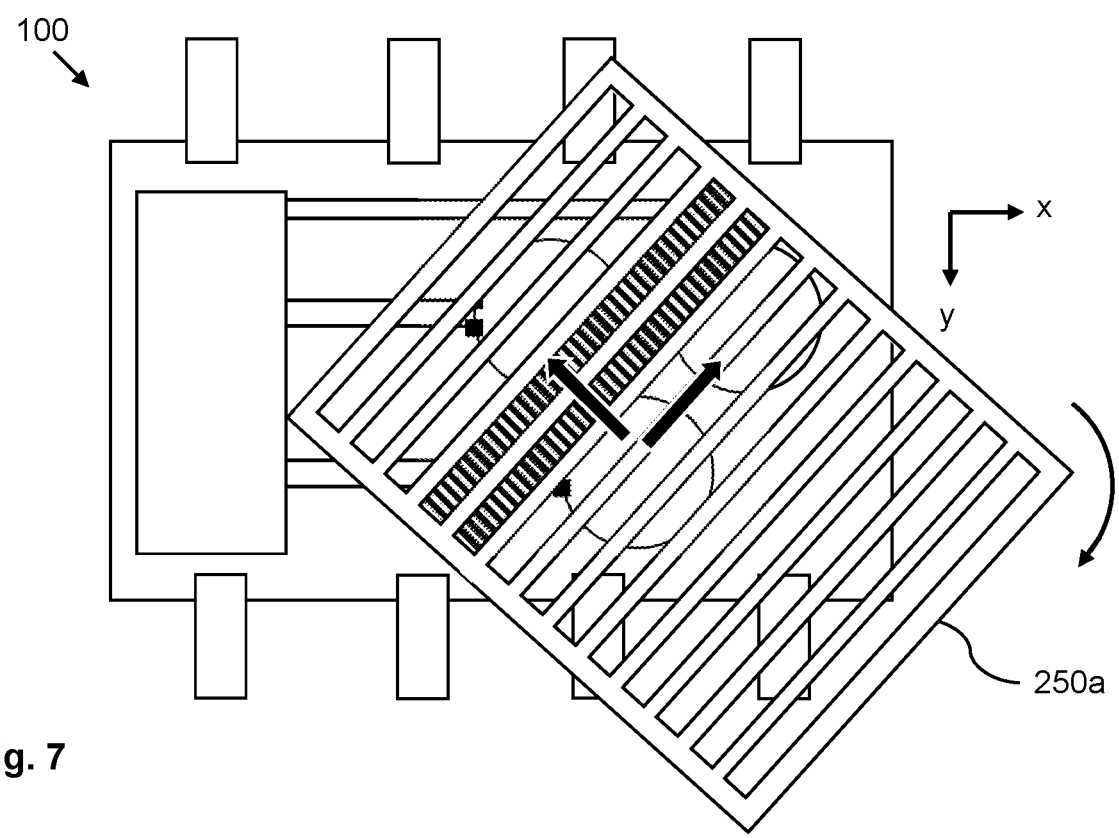

In the following description, various embodiments of the invention are described with reference to the following drawings, in which:

FIG. 1 shows a plan view of a sensor chip according to one embodiment example of the invention;

FIGS. 2*a, b, c* show exemplary operational modes of the sensor elements of the sensor chip shown in FIG. 1;

FIG. 2*d* shows a generic magnetic flux coupling between the sensor elements as shown in FIG. 2*a* and a target;

FIGS. 3*a, b, c* show different embodiment examples of a target according to the invention;

FIGS. 4*a, b, c, d, e* show the target according to the embodiment example of FIG. 3*a* arranged on top of the sensor elements as shown in FIG. 2*a* in different angular positions;

FIGS. 5*a, b* show a different embodiment of a target according to the invention arranged on top of the sensor elements as shown in FIG. 2*a*;

FIG. 6 shows a plan view of the sensor chip of FIG. 1 and the target according to the embodiment example of FIG. 3*a*; and FIG. 7 shows the plan view of the sensor chip and the target of FIG. 6, wherein the target is offset to the arrangement of the sensor chip.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

FIG. 1 shows a plan view of a sensor chip 100 according to one embodiment example of the invention. The sensor chip 100 can also be referred to as a sensor, a position sensor, an inductive sensor, or an inductive position sensor. The sensor chip 100 comprises an arrangement of sensor elements, here at least three sensor elements 120, 130, 140. Although in the here shown embodiment example three sensor elements are shown 120, 130, and 140, it is clear to a person skilled in the art that the here described aspects can also be implemented with just two sensor elements and here only three are shown for illustrative purposes. As such, the inventive concept is not construed to be limited to any specific number of sensor elements, and can be implemented with any number of sensor elements equal or greater than two, namely one transmitting sensor element and one receiving sensor element. The at least three sensor elements 120, 130, 140 in the here shown embodiment example do not overlap each other and are indicated by single coil loops. However, it is contemplated by the person skilled in the art that also any other kind of sensor element can be used, which is able to produce and/or receive a magnetic field. It is also contemplated that the at least three sensor elements 120, 130, 140 may be different kinds of sensor elements.

In the embodiment example shown in FIG. 1, each sensor element possesses contacts 125, 135, 145. Via these contacts 125, 135, 145, signals or information in general may be propagated from the sensor elements 120, 130, 140 to an optional determination unit 110. Furthermore, the contacts 125, 135, 145 may be used to provide the sensor elements 120, 130, 140 with an alternating current to generate a magnetic field or to drive the sensor elements in general.

A person skilled in the art will contemplate that even so in the here shown embodiment example the determination unit 110 is part of the sensor chip 100, this is only for illustrative purposes and the determination unit 110 can also be external to the actual sensor chip 100 or can be absent all together.

The sensor chip 100 may also comprise contacts 105, with which the sensor chip 100 can be connected to circuit boards and with which signals can be inputted and outputted from and to the sensor chip 100. Thereby, the contacts 105 can either be connected to the determination unit 110, or if the determination unit 110 is absent, the contacts 105 can be connected to the contacts 125 and 135.

FIGS. 2*a*, 2*b*, 2*c*, and 2*b* show exemplary different operational modes of the three sensor elements 120, 130, and 140 of the sensor chip 100 depicted in FIG. 1. Thereby, the three sensor elements 120, 130, 140 are further denoted "TX" and "RX". Thereby, "TX" indicates that the respective sensor element is generating a magnetic field, as such the sensor element denoted "TX" can also be named transmitting sensor element. The sensor elements denoted "RX" receive the magnetic field, as such the sensor elements denoted "RX" can also be named receiving sensor elements. Although the at least three sensor elements 120, 130, 140 may be configured to change their operational modes, it may also be possible that at least one sensor element of the at least three sensor elements 120, 130, 140 keeps its operational mode while the respective other sensor elements change their operational modes. Furthermore, it is contemplated that the different sensor elements may change their sensitivity and/or the strength of the magnetic field they produce.

In FIG. 2*a* sensor element 140 is the transmitting sensor element and sensor elements 120 and 130 are the receiving sensor elements. In FIG. 2*b* sensor element 130 is the transmitting sensor element and sensor elements 120 and 140 are the receiving sensor elements. In FIG. 2*c* sensor element 120 is the transmitting sensor element and sensor elements 130 and 140 are the receiving sensor elements. As shown in FIGS. 2*a*, 2*b*, 2*c*, the sensor elements 120, 130, 140 may at one point in time be the transmitting sensor element and at another point in time the receiving sensor element. Thereby, the operational mode of the sensor elements 120, 130, and 140 may be timely varied during operation of the sensor chip 100. A person skilled in the art will understand that the operational modes of the sensor elements 120, 130, and 140 may be varied arbitrarily. For example, the operation modes may be varied cyclicly, anti-cyclicly or in any kind of permutation, for example a random permutation. Also, the at least three sensor elements 120, 130, 140 may have an idle operational mode, in which they neither generate nor receive the magnetic field. Although in the here shown embodiment example, it is shown that at one point in time two sensor elements are the receiving sensor elements and one sensor element is the transmitting one, it is also possible that two sensor elements are transmitting sensor elements, whereas the remaining one is the receiving one. Since the sensor elements 120, 130, 140 are able to individually switch their operational modes, arbitrary combinations are possible.

Only for illustrative purposes and with no limiting implications, the following description assumes a sensor element configuration as depicted in FIG. 2*a*.

FIG. 2*d* shows a generic magnetic flux coupling between the sensor elements as shown in FIG. 2*a* and a target. The sensor elements 120, 130, and 140 together with the target 250 may form or may be referred to as a system according to the invention. Thereby, the system comprises the three sensor elements 120, 130, 140 and the target 250. This system may also comprise the sensor chip 100 according to FIG. 1, which comprises the at least three sensor elements 120, 130, 140.

In FIG. 2d the target 250 is located above a plane in which the three sensor elements 120, 130, 140 are arranged. The target 250 is able of moving within this plane.

In the here shown embodiment example, sensor element 140 is the transmitting sensor element and sensor elements 120 and 130 are the receiving sensor elements.

The target 250 is configured to affect the magnetic flux coupling between the transmitting sensor element 140 and the receiving sensor elements 120 and 130. Thereby, the magnetic field emanated from the transmitting sensor element 140 causes eddy currents to flow within the target 250. The shape or form of the target 250 is thereby chosen as such, that the eddy currents flow in a predefined direction within the target 250. This causes the eddy currents to produce at least one directional magnetic field, which affects the magnetic field emanated by the transmitting sensor element 140. In detail, it deforms the course of the magnetic field lines of the emanated magnetic field. Hence, also the magnetic flux is affected. The resulting deformed magnetic field lines are roughly depicted by the dotted lines 230, 235 between the transmitting sensor element 140 and the respective receiving sensor elements 120, 130. In this case, the magnetic field lines, extend from the transmitting sensor element 140 to the respective receiving sensor element 120, 130, wherein they pass through the target 250.

The at least two receiving sensor elements 120, 130 receive the affected magnetic field, respectively encounter the affected magnetic flux, such that a current or voltage can be outputted by the two receiving sensor elements 120, 130. Hence, the at least two receiving sensor elements 120, 130 react to the transmitting sensor element 140, in such a way that the at least two receiving sensor elements 120, 130 are coupled to the at least one transmitting sensor element 140 via the target 250.

If the target 250 changes its position, the shape or form of the target 250 changes relatively to the magnetic field lines of the magnetic field generated by the transmitting sensor element 140, i.e. the magnetic field lines are differently affected, which in turn means the receiving sensor elements 120, 130 will encounter a different magnetic flux for different positions of the target 250.

For example, the shape or form of the target 250 may align the magnetic field lines along a particular direction, which is derivable from the shape or form of the target 250. If the transmitting sensor element 140 and at least one of the receiving sensor elements 120, 130 oppose each other along this particular direction, then the magnetic flux coupling between the transmitting sensor element 140 and the at least one of the receiving sensor elements 120, 130 is the highest. This means in turn, the respective receiving sensor element 120, 130 will measure a high induced current or voltage. The other respective receiving sensor element 120, 130, which does not oppose the transmitting sensor element 140 in the particular direction of the target 250 will encounter a lower magnetic flux. This means in turn, the respective receiving sensor element 120, 130 will measure a lower induced current or voltage. Since the induced currents or voltages measured by the receiving sensor elements 120, 103 are proportional to the amount of magnetic flux coupling, which is affected by the shape or form of the target 250, the respective currents or voltages allow a determination of the position of the target 250. In other words, due to the shape or form of the target 250, which is non-rotational invariant, different preferred directions are encountered at different positions of the target 250. Hence, at different positions of the target 250, different magnetic flux couplings between the transmitting sensor element 140 and the receiving sensor elements 120, 130 are encountered. This in turn means, different induced currents or voltages are encountered, from which the position of the target 250 can be determined. Thereby, the preferred direction in which the target 250 aligns the magnetic field lines is dependent upon its shape or form. It can also be said that it is dependent upon structures constituting the shape or form of the target 250. However, since the preferred direction of the shape or form of the target 250 is due to its invariance only predominant in one direction, an offset of the target 250 does not substantially change the relative currents or voltages measured by the receiving sensor elements 120 and 130, since their position with respect to each other is fixed and the preferred direction of the target 250 is not changed. This means the offset of the target 250 has the same relative effect on the magnetic flux coupling and as such on the measured currents or voltages.

The target 250 may have different shapes or forms. The shape or form of the target 250 is non-rotational invariant in the sense that a rotation about an axis in an arbitrary angle changes the shape or form of the target 250 as it is seen from the location of one of the at least three sensor elements. However, it is clear to the person skilled in the art, that there may be particular angles for which a rotation about this angle may result in the same shape or form of the target 250. For example, it may be possible that a rotation of the target 250 about an angle of 360° may result in the same shape or form of the target 250 as seen by a respective sensor element. In this case, the sensor elements may be configured to determine a position of the target 250 in a range of 360°. It can be said that the target 250 in this case has an ambiguity of 360°. In another embodiment, a rotation of the target 250 about an angle of 180° or any multiple thereof may result in the same shape or form of the target 250. In this case, the sensor elements may be configured to determine a position of the target 250 in a range of 180°. It can be said that the target 250 in this case has an ambiguity of 180°. In another embodiment, a rotation of the target 250 about an angle of 90° or any multiple thereof may result in the same shape or form of the target 250. In this case, the sensor elements may be configured to determine a position of the target 250 in a range of 90°. It can be said that the target 250 in this case has an ambiguity of 90°.

Figure 3B:
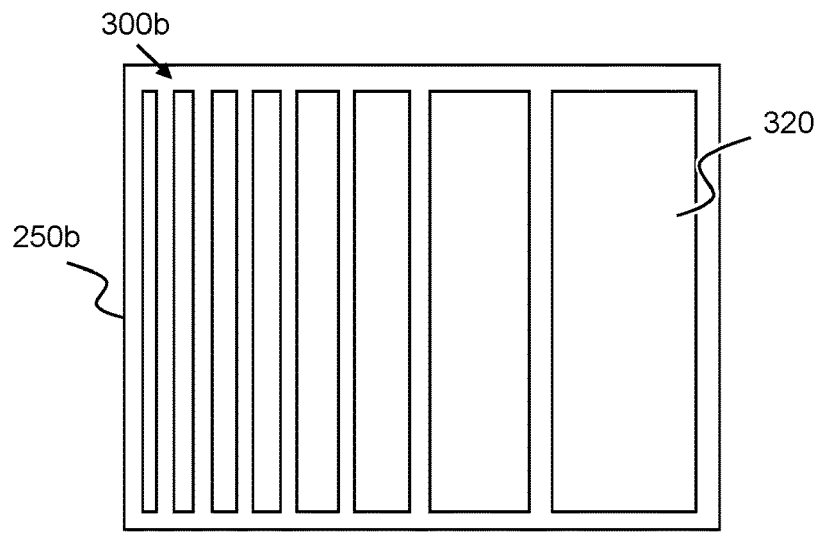
Figure 3C:
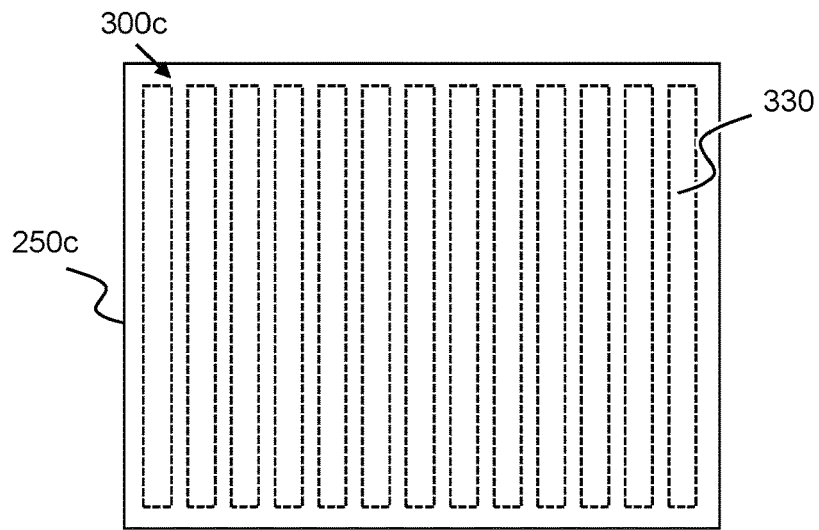

Different embodiment examples of the target 250 according to the invention are shown in FIGS. 3a, 3b, and 3c. Thereby, the different embodiment examples of the target 250 have different shapes or forms, which differently affect the magnetic flux coupling between the transmitting sensor element 140 and the two receiving sensor elements 120 and 130. In more detail, the target 250 according to the embodiment example of FIGS. 3a, 3b, and 3c exhibits different patterns 300a, 300b, and 300c, respectively.

The shape or form of the target 250a shown in FIG. 3a comprises a number of slits 320, wherein the number of slits 320 may be any number of slits. A slit in the target 250a may extend from one side of the target 250a to the opposite side. For example, the slits 320 may be a hole in the target 250a, wherein said hole has a depth of the entire thickness of the target 250a. The slits 320 are thereby arranged as such that they direct the flow of the eddy currents within the target 250a, such that the target 250a affects the emanated magnetic field in a preferred direction. Thereby, the slits 320 may have any shape or form that is suitable to direct the flow of the eddy currents. As shown in FIG. 3a, the slits 320 may be arranged in a particular pattern 300a, which is depicted in FIG. 3a by a number of slits 320 having an equal width and length, which are arranged parallel to each other and extend across at least one dimension of the target 250a. As shown in FIG. 3a, the pattern 300a may be represented by a ladder. With the pattern 300a as depicted in FIG. 3a, a 180° ambiguity is encountered, since with a 180° rotation of the target 250a, the same pattern 300a as with 0° is encountered. It can also be said the pattern 300a given by the slits 320 is mirror-symmetrically in two directions. Hence, the target 250a comprises a two-directional mirror symmetry. However, the slits 320 are not limited to equal slits and furthermore their size may vary, for example in a particular manner, which is illustrated in FIG. 3b by ease of an increasing width of the slits 320, which is increasing in the direction of one dimension of the target 250b. This is represented by the pattern 300b. Thereby, the width may gradually increase. The respective target 250b has a one-axis symmetry, such that it has a 360° ambiguity, since with a 360° rotation of the target 250b, the same pattern 300b as with 0° is encountered. It can also be said the pattern 300b given by the slits 320 is mirror-symmetrically in one direction. Hence, the target 250b comprises a one-directional mirror symmetry. Furthermore, the size of the slits 320 may also vary in any other manner, for example the width of the slits 320 may first increase and then decrease with respect to the same direction. In another example, the width of the slits 320 may be distributed following a gradient across one dimension of the target 250b.

In another embodiment of the target 250d according to the invention, the slits 320 may be angled or tilted with respect to one another, such a target 250d is shown in FIG. 5. For example, the angle of the tilt may increase from one slit 320 to another in one direction of the extend of the target 250d. In another embodiment of the target 250 according to the invention, the slits may have a curved shape.

The target 250c as shown in FIG. 3c comprises recesses 330, which are illustrated by ease of dashed lines, instead of slits 320. A recess 330 may extend from one side of the target 250c to a point somewhere inside of the body of the target 250c and does not extend to the opposite side of the target 250c. The recesses 330 may have any shape or form that is suitable to affect the magnetic flux coupling between the at least one transmitting sensor element 140 and the at least two receiving sensor elements 120, 130 and may be arranged in a similar manner as the aforementioned slits 320, thereby forming pattern 300c.

Although the outer shapes of the targets 250a, b, c depicted in FIGS. 3a, 3b, and 3c are illustrated as rectangles, the outer shape of the targets 250a, b, c according to the invention are not limited to rectangular shapes. The target 250 may also have a shape of a triangle, a square, a diamond, a trapeze, a circle, an ellipse, an oval, or any other shape, which is suitable.

The target 250 may have a size of 10 mm by 10 mm. The slits 320 or recesses 330 in the target 250 may have a size of 0.3 mm by 0.9 mm. It is clear to a person skilled in the art that these sizes are only named for exemplary purposes and shall not be understood to be limiting. It is also clear that the shapes of the target may be different and only the area, where recesses and/or slits are formed, can have the aforementioned size.

Further, the pattern of the slits 320 and/or recesses 330 in the target 250 may extended to a much larger area as the sensor in a way that the target 250 may be greater than the area, which is represented by the at least three sensor elements 120, 130, 140. The at least three sensor elements may each have a maximum size of 5 mm, 8 mm, 10 mm, 15 mm, 20 mm, or 30 mm. The maximum size may be a diameter of a sensor element, an envelope of a sensor element or a length of the longest side of a sensor element or the maximum extend of all sensor elements together in one dimension.

The recesses 330 or slits 320 of the target 250 may also be adapted to change their size and/or their orientation. For example, the slits 320 may be adapted to change their size and/or their orientation adaptively dependent on the movement of the target 250, i.e. during operations.

In all of the examples shown in FIGS. 3a, 3b, and 3c, the target 250a, b, c may comprise a conductive material. For example, the target 250a, b, c may be made at least partially from a conductive material.

It is clear to a person skilled in the art that even so concrete examples of targets 250a to 250e have been shown here, these targets 250a to 250e are only of an exemplary manner and are not intended to be limiting. Also other targets fall in the scope of the invention. A person skilled in the art will also contemplate that targets with slits 320 and recesses 330 may be formed.

FIGS. 4a, 4b, 4c, 4d, and 4e shows the target 250a as depicted in FIG. 3a located above sensor elements 120, 130, 140 in different angular positions. Thereby, the target 250a is chosen to exhibit the pattern 300a of slits 320 as depicted in FIG. 3a. Although the target 250a is chosen for illustrative purposes, it shall be mentioned that the inventive concept is also applicable to other targets and that only for simplification reasons the target 250a is chosen, but the following is not to be construed to be limited to the target 250a.

The position of the target 250a as shown in FIG. 4a may be referred to as a neutral position, a baseline position or a zero position. In the embodiment example shown in FIG. 4a, a first side of the rectangular target 250a may be aligned with the axis x. Perpendicular to the axis x, the target 250a comprises the slits 320. When the sensor element 140 produces a magnetic field, the magnetic field lines of the magnetic field are affected by the shape or form of the target 250a, in detail by the magnetic field generated by the eddy currents induced within the target 250a, wherein the eddy currents flow around the slits 320 in the here shown embodiment example. This may result in an alignment of the magnetic field lines of the emanated magnetic field with the orientation of the slits 320. Consequently, the sensor elements 120, 130 experience a similar magnetic flux, when the target 250a is in the neutral position. Hence, both sensor elements 120, 130 will output merely the same current or voltage, due to the fact that they will encounter the same magnetic flux. In FIG. 4a, this magnetic flux coupling is represented by the broad black arrows, which connect the transmitting sensor element 140 and the respective receiving sensor elements 120, 130. This magnetic flux coupling has to pass one slit of the target 250a for receiving sensor element 120 and receiving sensor element 130. This is highlighted by the shaded slit 320.

In the here shown embodiment example the magnetic flux coupling takes place in a direction, which has a component parallel to a particular direction, namely along the non slitted area, and a component perpendicular to said particular direction. The greater the perpendicular component is, the more will the magnetic flux, which is measured by the respective sensor element 120, 130, be reduced. In FIG. 4a, the perpendicular components are substantially equal for both of the receiving sensor elements 120, 130. The magnetic flux, which is encountered by the receiving sensor elements 120, 130, is therefore substantially the same. This in turn means, both receiving sensor elements 120, 130 will measure substantially the same induced current or voltage.

Figure 4B:
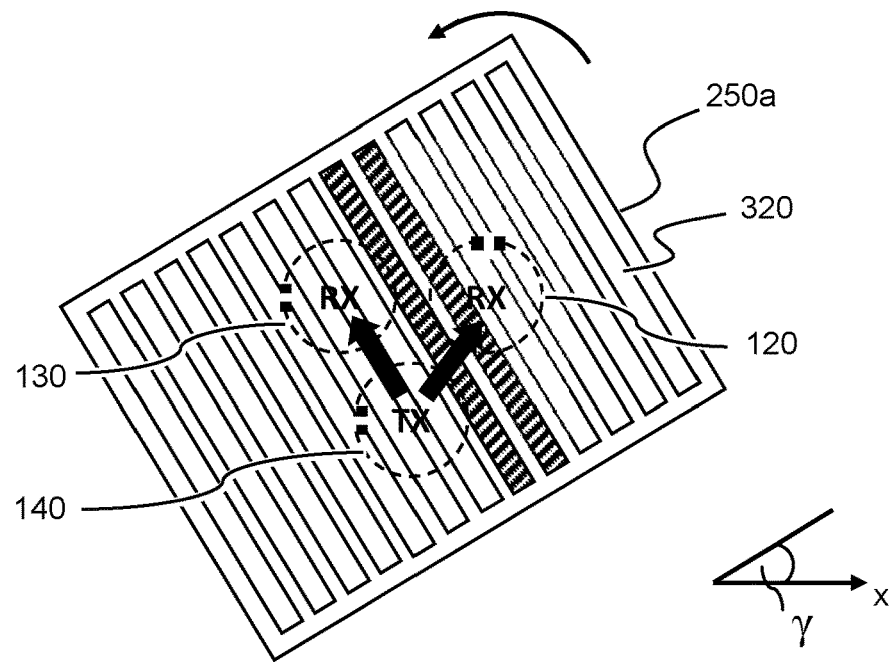

In FIG. 4b the same configuration as shown in FIG. 4a is shown, but the target 250a is rotated by an angle γ in the direction of the black curved arrow. In the here shown embodiment example, γ may be 30°. The resulting magnetic flux coupling, which is illustrated by the broad black arrows, is now different for the respective receiving sensor elements 120, 130. For receiving sensor element 130, the magnetic field lines, which are aligned with the direction of the slits 320, are also aligned with a connection line between the transmitting sensor element 140 and the receiving sensor element 130. As such, the direction of the magnetic flux coupling has a high component parallel to the preferred direction of the target 250a, while the perpendicular component is very low. The latter may be visualized by the fact that the broad black arrow, which illustrates the magnetic flux coupling, is aligned with the slits 320 for receiving sensor element 130. For the receiving sensor element 120, the direction of the magnetic flux, however, has a high component perpendicular to the preferred direction. This may be visualized by the broad black arrow passing two slits 320. This results in a difference in the magnetic flux, which is encountered by the respective receiving sensor elements 120, 130. This difference causes that the receiving sensor elements 120, 130 measure different induced currents or voltages. These different currents or voltages then allow to determine the position of the target 250a. In the here shown embodiment examples the different currents or voltages allow to determine the angle of the target 250a with respect to the sensor elements 120, 130, 140.

Figure 4C:
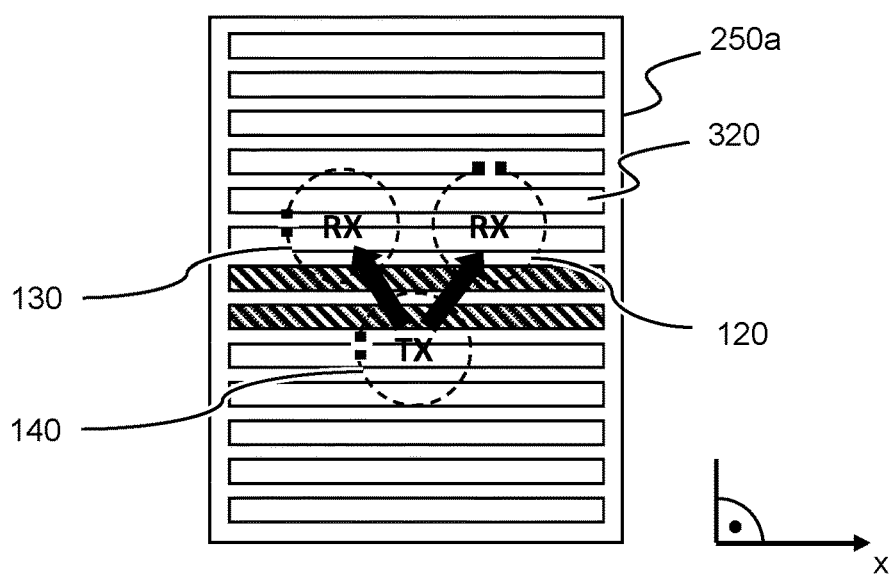

In FIG. 4c the target 250a is rotated by another 60°. In this case, both receiving sensor elements 120, 130 measure a reduced magnetic field of substantially the same magnitude. This is because the broad black arrows, which illustrate the magnetic flux coupling, have similar components parallel and perpendicular to the preferred direction. This in turn means that the measured induced currents or voltages of the receiving elements 120 and 130 are substantially the same again, but lower than the ones which are measured in the neutral position of the target 250a as depicted in FIG. 4a. The latter can be seen by the broad black arrows passing two slits 320 for each of the receiving sensor elements, 120, 130 in FIG. 4c, whereas the broad black arrows as depicted in FIG. 4a pass one slit 320 for each of the receiving sensor elements 120, 130.

If only the ratios of the induced currents or voltages measured at the respective receiving elements 120, 130 are compared between the positions of the target 250a as depicted in FIG. 4a and FIG. 4c, a rotation of the target 250a of only about 90° can be arbitrarily determined. This is because comparing the ratios of the currents or voltages of the receiving elements 120 and 130 will result in the same value for the position of the target 250a as depicted in FIG. 4a and FIG. 4c, since the receiving sensor elements 120 and 130 will both measure merely the same induced current or voltage values for both positions. However, if also the magnitude of the induced current and voltage values are accounted for, then also a rotation of the target 250a of about 180° can be arbitrarily determined.

This is due to the fact that the absolute value of the induced current or voltage is reduced for the position of the target 250 as depicted in FIG. 4c than compared to FIG. 4a. For example, even if for the target 250 the ratio of the measured induced currents or voltages between the receiving sensor elements 120 and 130 is the same for the angle of 0° (FIG. 4a) and 90° (FIG. 4c), the absolute value is different, because the target 250 is non-rotational invariant with respect to a rotation of about 90°. Hence, by accounting also for the magnitude of the measured induced currents or voltages an angular position of the target between 0° and 180° can be determined.

Figure 4D:
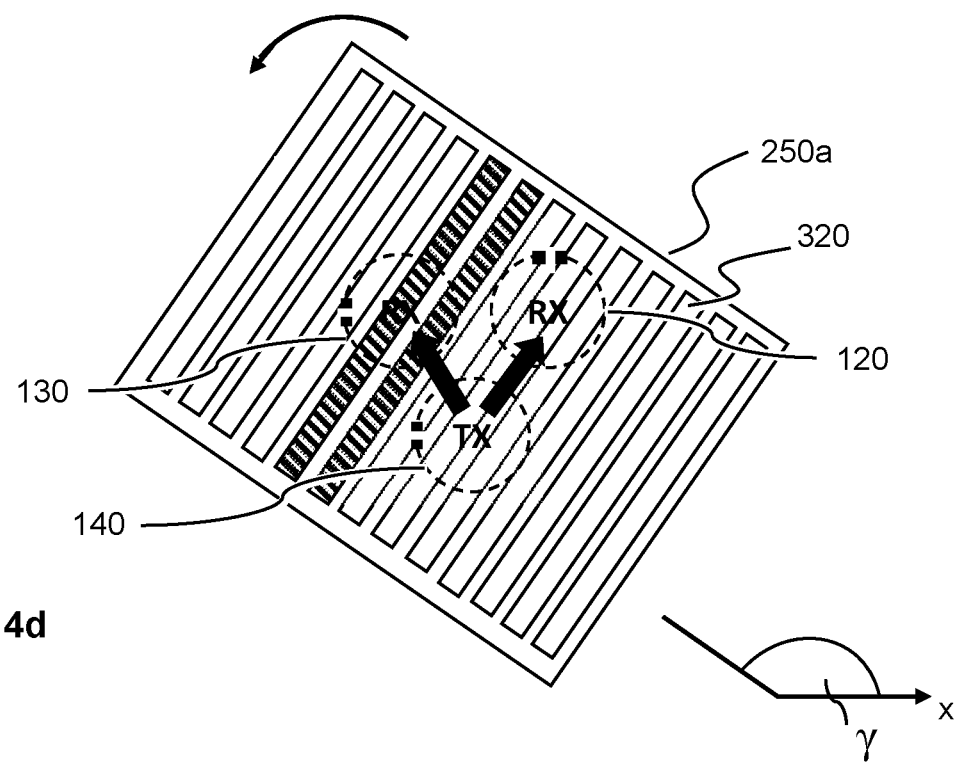

In FIG. 4d the target 250a is rotated by another 60°. The resulting magnetic flux coupling, which is illustrated by the broad black arrows, is again different for the respective receiving sensor elements 120, 130. Here the magnetic flux coupling between the transmitting sensor element 140 and the receiving sensor element 120 has a high component parallel to the preferred direction and a low perpendicular component, whereas the situation is vice versa for receiving sensor element 130. This difference causes that the receiving sensor elements 120, 130 measure different induced currents or voltages.

Figure 4E:
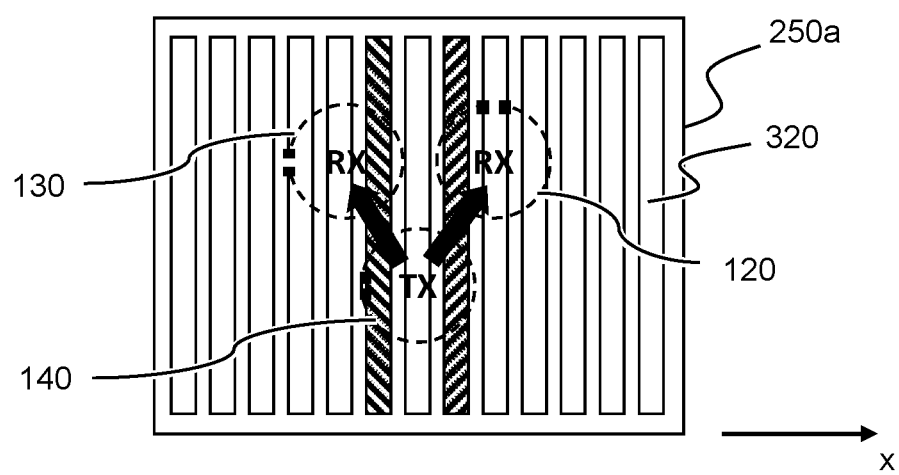

In FIG. 4e the target 250a is rotated by another 30°. It is clear to the person skilled in the art that the receiving sensor elements 120 and 130 measure substantially the same induced current or voltage, since the target 250a has been rotated by 180° and has as such substantially the same orientation and preferred direction of affecting the emanated magnetic field as in FIG. 4a. However, it may also be clear to the person skilled in the art that deviations and imperfections caused by the manufacturing process of the target 250a may prevent the target 250a from being absolutely symmetric with respect to a rotation of 180°.

If the operational mode of the producing and receiving sensor elements 120, 130, 140 is changed during the rotation, for example as depicted in FIGS. 2a, b, c, then for every angle between the neutral position and 360° can be determined. Furthermore, also by using different shaped or forms of the target 250, as shown in FIGS. 3b and 3c even without operational mode changing the range of the arbitrary position determination can be enhanced. For example, whereas the shape or form of the target 250a as depicted in FIG. 3a is rotational invariant with respect to a rotation of about 180° and every multiple thereof, and therefore has an 180° ambiguity, the shape or form of the target 250b as depicted in FIG. 3b is rotational invariant with respect to a rotation of about 360° and every multiple thereof and therefore has an 360° ambiguity. Therefore, the target 250b as depicted in FIG. 3b may allow for sensing the position of the target 250b in the range between the neutral position and 360° without operational mode change.

FIGS. 5a and 5b show a target 250d arranged over sensor elements 120, 130, 140 for a linear position sensing.

In FIG. 5a, the target 250d is located in a first position, in which the sensor elements 120, 130, 140 are in the middle of the target 250d. This first position may also be referred to as a neutral position, a baseline position, or a zero position. However, in another embodiment of the invention, another position, for example a position at one of the end areas of the target 250d, may represent such a neutral, baseline, or zero position. However, in yet another embodiment, any other position in between the center and the one or two end areas of the target 250d may represent such a neutral, baseline or zero position.

In FIG. 5b, the target 250d is moved in a linear manner relatively to the sensor elements 120, 130, 140 in direction of the arrow into a second position.

Due to the fact that the slits 320 of the target 250d depicted in FIGS. 5a and 5b are tilted or angled with respect to one another, the linear movement of the target 250d relatively to the sensor elements 120, 130, 140 causes a change in the magnetic flux coupling of the transmitting sensor element 140 and the receiving sensor elements 120, 130. Because the slits 320 are angled with respect to one another, said linear movement causes the target 250d to affect the magnetic flux coupling similar to a rotational movement as described with respect to FIGS. 4a, 4b, 4c, 4d, and 4e. Therefore, it may be said that by using a target 250d with tilted or angled slits 320 for sensing a linear position, a linear motion of the target 250d relatively to the sensor elements 120, 130, 140 imitates an angular motion, by ease of the tilted or angled slits 320. Thereby, it can be said that each slit 320 defines locally another preferred direction of affecting the emanated magnetic field. Hence, by moving the target 250d linearly over sensor elements 120, 130, and 140 for each position a new preferred direction is encountered, such that the position of the target 250d can be determined.

In FIG. 5a the magnetic flux coupling between the transmitting sensor element 140 and the receiving sensor elements 120 and 130 is merely equal, since the magnetic flux coupling for both receiving sensor elements 120 and 130 have the same parallel and perpendicular component as compared to the localized preferred direction. Hence, both receiving sensor elements 120 and 130 will merely measure the same induced currents or voltages.

In FIG. 5b the transmitting sensor element 140 and the receiving sensor element 130 lie within a localized preferred direction. Hence, the magnetic flux coupling between these sensor elements is high. Contrary to this, the connecting line between the transmitting sensor element 140 and the receiving sensor element 120 is substantially perpendicular to the localized preferred direction. Hence, the magnetic flux coupling of the transmitting sensor element 140 and the respective receiving sensor element 120 is reduced. Hence, the receiving sensor element 130 will measure a higher induced current or voltage than the receiving sensor element 120.

FIG. 6 shows a plan view of the sensor chip 100, which may be the sensor chip 100 depicted in FIG. 1, and the target 250a according to the embodiment example of FIG. 3a. As illustrated by ease of the curved arrow shown in FIG. 6, the target 250a is configured to rotate with respect to the sensor elements of the sensor chip 100, which determine the angular position of the target 250a.

FIG. 7 shows a plan view of the sensor chip 100 and the target 250a of FIG. 6, wherein the rotation axis of the target 250a is offset to the rotational axis as shown in FIG. 6. The offset is a translational offset in x- and y-direction.

The offset of the target 250a does not have a substantial effect on the operation of the sensor chip 100 according to the invention. As has been described herein, this is due to the fact that the magnetic flux coupling of the respective sensor elements is measured by the sensor elements instead of a magnetic field, which may be generated by the target 250a as known in the art. According to the invention, the shape or form of the target 250a affects the magnetic field lines and therefore affects the magnetic flux, which then has an effect on the magnetic flux coupling of the respective sensor elements. This magnetic flux coupling is only dependent on the shape or form of the target 250a, which may for example be characterized by recesses and/or slits. Because these recesses or slits change the magnetic flux in a particular direction, which is defined by the shape or form of the recesses and/or slits, the arrangement of the coils of the sensor chip 100 is invariant to offsets. As evident from a comparison of FIGS. 6 and 7, the pattern of slits of the target 250a causes in the non-offset situation still the same magnetic flux coupling between the transmitting sensor element and the receiving sensor elements as in the offset situation, because of its non-rotational invariant form, respectively the non-rotational invariant pattern of slits and/or recesses. Thereby, the magnetic flux coupling is indicated by the thick black arrows, as already explained in context of FIGS. 4a-e. Even if the target 250a is offset, the preferred direction remains unchanged, only the absolute values of the induced currents or voltages may be influences by the offset, but not the relative values, such that the offset does not degrade the determination capability.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims.

The invention claimed is:

1. An apparatus for sensing a position of a target, the apparatus comprising:
    at least two sensor elements and a target,
    wherein at least one sensor element of the at least two sensor elements generates a magnetic field,
    wherein at least one other sensor element of the at least two sensor elements receives the magnetic field and outputs at least one signal associated with the received magnetic field,
    wherein the target affects a coupling of a magnetic flux of the magnetic field between the at least one sensor element generating the magnetic field and the at least one other sensor element receiving the magnetic field and
    wherein the target is non-rotational invariant and comprises at least one slit and/or recess oriented along a preferred direction for the magnetic flux coupling to produce at least one directional magnetic field which deforms the course of the magnetic field lines of the generated magnetic field.

2. The apparatus according to claim 1, wherein the apparatus comprises:
    at least three sensor elements,
    wherein at least one sensor element of the at least three sensor elements generates the magnetic field, and wherein at least two sensor elements of the at least three sensor elements receive the magnetic field and output at least one signal associated with the received magnetic field, or
    wherein at least two sensor elements of the at least three sensor elements generate a first and a second magnetic field, and
    wherein at least one sensor element of the at least three sensor elements receives a superposition of the first and second magnetic field and outputs at least one signal associated with the received superposition of the first and second magnetic field.

3. The apparatus according to claim 2, wherein at least two of the at least three sensor elements are pairwise opposing each other and the at least one other of the at least three sensor elements is spatially distant to the at least two sensor elements.

4. The apparatus according to claim 3, wherein the at least three sensor elements are arranged in a triangular shape.

5. The apparatus according to claim 1, wherein at least one sensor element is arranged within a first plane and wherein at least a surface of the target facing the at least two sensor elements is moving in a second plane, which is spatially distant to the first plane.

6. The apparatus according to claim 1, wherein each of the at least two sensor elements is configured to change its operation mode independently from generating a magnetic field to receiving a magnetic field and vice versa.

7. The apparatus according to claim 1, wherein the magnetic field is an alternating magnetic field.

8. The apparatus according to claim 1, wherein the at least two sensor elements are integrated together with means for driving the at least one sensor element generating the magnetic field and/or means for processing the outputted at least one signal in one die or a molded package.

9. A target configured to be used with an apparatus for sensing a position of the target,
wherein the apparatus comprises at least two sensor elements,
wherein at least one sensor element of the at least two sensor elements generates a magnetic field and wherein at least one other sensor element of the at least two sensor elements receives the magnetic field and outputs at least one signal associated with the received magnetic field,
wherein the target comprises at least one slit and/or recess oriented along a preferred direction and wherein the target is configured to affect a coupling of a magnetic flux of the magnetic field between the at least one sensor element generating the magnetic field and the at least one other sensor element receiving the magnetic field in the preferred direction by producing at least one directional magnetic field which deforms the course of the magnetic field lines of the generated magnetic field and wherein the target is non-rotational invariant.

10. The target according to claim 9, wherein the target comprises a plurality of closed discrete structures of electrically conductive paths for allowing eddy currents to flow therein.

11. The target according to claim 10, wherein the discrete structures have an operational predefined size larger than the at least one sensor element receiving the magnetic field.

12. The target according to claim 9, wherein a surface of the target facing the at least two sensor elements defines a target plane and the target is translational invariant on at least one axis comprised in the target plane.

13. A method for sensing the position of a target, the method comprising:
generating a magnetic field by at least one sensor element of at least two sensor elements;
receiving the magnetic field by at least one other sensor element of the at least two sensor elements and outputting at least one signal associated with the received magnetic field;
wherein the target comprises at least one slit and/or recess oriented along a preferred direction and wherein the target is configured to affect a coupling of a magnetic flux of the magnetic field between the at least one sensor element generating the magnetic field and the at least one other sensor element receiving the magnetic field in the preferred direction by producing at least one directional magnetic field which deforms the course of the magnetic field lines of the generated magnetic field and wherein the target is non-rotational invariant.

* * * * *